United States Patent
Yang et al.

(10) Patent No.: US 7,545,004 B2
(45) Date of Patent: Jun. 9, 2009

(54) METHOD AND STRUCTURE FOR FORMING STRAINED DEVICES

(75) Inventors: Haining S. Yang, Wappingers Falls, NY (US); Eng Hua Lim, Singapore (SG)

(73) Assignee: International Business Machines Corporation, Armonk, NY (US)

( * ) Notice: Subject to any disclaimer, the term of this patent is extended or adjusted under 35 U.S.C. 154(b) by 352 days.

(21) Appl. No.: 10/907,689

(22) Filed: Apr. 12, 2005

(65) Prior Publication Data
US 2006/0228836 A1    Oct. 12, 2006

(51) Int. Cl.
*H01L 29/78* (2006.01)
*H01L 29/34* (2006.01)

(52) U.S. Cl. .................... 257/369; 257/371; 257/635; 257/E29.108

(58) Field of Classification Search ........... 257/255, 257/371, 389, 632, 635, 640, 649, 369, E29.106–E29.108, 257/E25.01–E25.012; 438/199, 761, 763, 438/791
See application file for complete search history.

(56) References Cited

U.S. PATENT DOCUMENTS

| | | | |
|---|---|---|---|
| 3,602,841 A | 8/1971 | McGroddy | |
| 4,665,415 A | 5/1987 | Esaki et al. | |
| 4,853,076 A | 8/1989 | Tsaur et al. | |
| 4,855,245 A | 8/1989 | Neppl et al. | |
| 4,952,524 A | 8/1990 | Lee et al. | |
| 4,958,213 A | 9/1990 | Eklund et al. | |
| 5,006,913 A | 4/1991 | Sugahara et al. | |
| 5,060,030 A | 10/1991 | Hoke | |
| 5,081,513 A | 1/1992 | Jackson et al. | |
| 5,108,843 A | 4/1992 | Ohtaka et al. | |
| 5,134,085 A | 7/1992 | Gilgen et al. | |
| 5,310,446 A | 5/1994 | Konishi et al. | |
| 5,354,695 A | 10/1994 | Leedy | |

(Continued)

FOREIGN PATENT DOCUMENTS

JP    60-52052    3/1985

(Continued)

OTHER PUBLICATIONS

Kern Rim, et al., "Transconductanse Enhancement in Deep Submicron Strained-Si *n*-MOSFETs", International Electron Devices Meeting, 26, 8, 1, IEEE, Sep. 1998.

(Continued)

*Primary Examiner*—Douglas M Menz
*Assistant Examiner*—Matthew W Such
(74) *Attorney, Agent, or Firm*—James J. Cioffi; Greenblum & Bernstein P.L.C.

(57) ABSTRACT

A method for manufacturing a device includes mapping extreme vertical boundary conditions of a mask layer based on vertical edges of a deposited first layer and a second layer. The mask layer is deposited over portions of the second layer based on the mapping step. The exposed area of the second layer is etched to form a smooth boundary between the first layer and the second layer. The resist layer is stripped. The resulting device is an improved PFET device and NFET device with a smooth boundary between the first and second layers such that a contact can be formed at the smooth boundary without over etching other areas of the device.

4 Claims, 17 Drawing Sheets

U.S. PATENT DOCUMENTS

| | | | |
|---|---|---|---|
| 5,371,399 | A | 12/1994 | Burroughes et al. |
| 5,391,510 | A | 2/1995 | Hsu et al. |
| 5,459,346 | A | 10/1995 | Asakawa et al. |
| 5,471,948 | A | 12/1995 | Burroughes et al. |
| 5,557,122 | A | 9/1996 | Shrivastava et al. |
| 5,561,302 | A | 10/1996 | Candelaria |
| 5,565,697 | A | 10/1996 | Asakawa et al. |
| 5,571,741 | A | 11/1996 | Leedy |
| 5,592,007 | A | 1/1997 | Leedy |
| 5,592,018 | A | 1/1997 | Leedy |
| 5,670,798 | A | 9/1997 | Schetzina |
| 5,679,965 | A | 10/1997 | Schetzina |
| 5,683,934 | A | 11/1997 | Candelaria |
| 5,840,593 | A | 11/1998 | Leedy |
| 5,847,419 | A | 12/1998 | Imai et al. |
| 5,861,651 | A | 1/1999 | Brasen et al. |
| 5,880,040 | A | 3/1999 | Sun et al. |
| 5,940,736 | A | 8/1999 | Brady et al. |
| 5,946,559 | A | 8/1999 | Leedy |
| 5,960,297 | A | 9/1999 | Saki |
| 5,989,978 | A | 11/1999 | Peidous |
| 6,008,126 | A | 12/1999 | Leedy |
| 6,025,280 | A | 2/2000 | Brady et al. |
| 6,046,464 | A | 4/2000 | Schetzina |
| 6,066,545 | A | 5/2000 | Doshi et al. |
| 6,090,684 | A | 7/2000 | Ishitsuka et al. |
| 6,107,143 | A | 8/2000 | Park et al. |
| 6,117,722 | A | 9/2000 | Wuu et al. |
| 6,133,071 | A | 10/2000 | Nagai |
| 6,165,383 | A | 12/2000 | Chou |
| 6,221,735 | B1 | 4/2001 | Manley et al. |
| 6,228,694 | B1 | 5/2001 | Doyle et al. |
| 6,246,095 | B1 | 6/2001 | Brady et al. |
| 6,255,169 | B1 | 7/2001 | Li et al. |
| 6,261,964 | B1 | 7/2001 | Wu et al. |
| 6,265,317 | B1 | 7/2001 | Chiu et al. |
| 6,274,444 | B1 | 8/2001 | Wang |
| 6,281,532 | B1 | 8/2001 | Doyle et al. |
| 6,284,623 | B1 | 9/2001 | Zhang et al. |
| 6,284,626 | B1 | 9/2001 | Kim |
| 6,319,794 | B1 | 11/2001 | Akatsu et al. |
| 6,361,885 | B1 | 3/2002 | Chou |
| 6,362,082 | B1 | 3/2002 | Doyle et al. |
| 6,368,931 | B1 | 4/2002 | Kuhn et al. |
| 6,403,486 | B1 | 6/2002 | Lou |
| 6,403,975 | B1 | 6/2002 | Brunner et al. |
| 6,406,973 | B1 | 6/2002 | Lee |
| 6,461,936 | B1 | 10/2002 | von Ehrenwall |
| 6,476,462 | B2 | 11/2002 | Shimizu et al. |
| 6,483,171 | B1 | 11/2002 | Forbes et al. |
| 6,493,497 | B1 | 12/2002 | Ramdani et al. |
| 6,498,358 | B1 | 12/2002 | Lach et al. |
| 6,501,121 | B1 | 12/2002 | Yu et al. |
| 6,506,652 | B2 | 1/2003 | Jan et al. |
| 6,521,964 | B1 | 2/2003 | Jan et al. |
| 6,531,369 | B1 | 3/2003 | Ozkan et al. |
| 6,531,740 | B2 | 3/2003 | Bosco et al. |
| 6,573,172 | B1 * | 6/2003 | En et al. ............... 438/626 |
| 6,509,618 | B2 | 7/2003 | Jan et al. |
| 6,621,392 | B1 | 9/2003 | Volant et al. |
| 6,635,506 | B2 | 10/2003 | Volant et al. |
| 6,717,216 | B1 | 4/2004 | Doris et al. |
| 6,825,529 | B2 | 11/2004 | Chidambarrao et al. |
| 6,831,292 | B2 | 12/2004 | Currie et al. |
| 6,974,981 | B2 | 12/2005 | Chidambarrao et al. |
| 6,977,194 | B2 | 12/2005 | Belyansky et al. |
| 7,015,082 | B2 | 3/2006 | Doris et al. |
| 7,205,615 | B2 * | 4/2007 | Tsutsui et al. .......... 257/369 |
| 7,220,630 | B2 * | 5/2007 | Cheng et al. ........... 438/199 |
| 2001/0009784 | A1 | 7/2001 | Ma et al. |
| 2002/0063292 | A1 | 5/2002 | Armstrong et al. |
| 2002/0074598 | A1 | 6/2002 | Doyle et al. |
| 2002/0086472 | A1 | 7/2002 | Roberds et al. |
| 2002/0086497 | A1 | 7/2002 | Kwok |
| 2002/0090791 | A1 | 7/2002 | Doyle et al. |
| 2003/0032261 | A1 | 2/2003 | Yeh et al. |
| 2003/0040158 | A1 * | 2/2003 | Saitoh .................. 438/279 |
| 2003/0057184 | A1 | 3/2003 | Yu et al. |
| 2003/0067035 | A1 | 4/2003 | Tews et al. |
| 2003/0181005 | A1 | 9/2003 | Hachimine et al. |
| 2004/0029323 | A1 * | 2/2004 | Shimizu et al. ......... 438/142 |
| 2004/0075148 | A1 * | 4/2004 | Kumagai et al. ........ 257/369 |
| 2004/0238914 | A1 | 12/2004 | Deshpande et al. |
| 2004/0262784 | A1 | 12/2004 | Doris et al. |
| 2005/0040460 | A1 | 2/2005 | Chidambarrao et al. |
| 2005/0082634 | A1 | 4/2005 | Doris et al. |
| 2005/0093030 | A1 | 5/2005 | Doris et al. |
| 2005/0098829 | A1 | 5/2005 | Doris et al. |
| 2005/0106799 | A1 | 5/2005 | Doris et al. |
| 2005/0145954 | A1 | 7/2005 | Zhu et al. |
| 2005/0148146 | A1 | 7/2005 | Doris et al. |
| 2005/0194699 | A1 | 9/2005 | Belyansky et al. |
| 2005/0214998 | A1 * | 9/2005 | Chen et al. ............. 438/199 |
| 2005/0236668 | A1 | 10/2005 | Zhu et al. |
| 2005/0245017 | A1 | 11/2005 | Belyansky et al. |
| 2005/0280051 | A1 | 12/2005 | Chidambarrao et al. |
| 2005/0282325 | A1 | 12/2005 | Belyansky et al. |
| 2006/0027868 | A1 | 2/2006 | Doris et al. |
| 2006/0043422 | A1 * | 3/2006 | Chen et al. ............. 257/202 |
| 2006/0051922 | A1 * | 3/2006 | Huang et al. ........... 438/282 |
| 2006/0057787 | A1 | 3/2006 | Doris et al. |
| 2006/0060925 | A1 | 3/2006 | Doris et al. |
| 2006/0099763 | A1 * | 5/2006 | Liu et al. .............. 438/299 |
| 2006/0148181 | A1 * | 7/2006 | Chan et al. ............. 438/289 |
| 2006/0199326 | A1 * | 9/2006 | Zhu et al. .............. 438/201 |

FOREIGN PATENT DOCUMENTS

| | | |
|---|---|---|
| JP | 64-76755 | 3/1989 |
| JP | 2002-93921 | 3/2002 |
| WO | WO 0247167 A1 * | 6/2002 |

OTHER PUBLICATIONS

Kern Rim, et al., "Characteristics and Device Design of Sub-100 nm Strained Si N- and PMOSFETs", 2002 Symposium On VLSI Technology Digest of Technical Papers, IEEE, pp. 98-99.

Gregory Scott, et al., "NMOS Drive Current Reduction Caused by Transistor Layout and Trench Isolation Induced Stress", International Electron Devices Meeting, 34.4.1, IEEE, Sep. 1999.

F. Ootsuka, et al., " Highly Dense, High-Performance 130nm node CMOS Technology for Large Scale System-on-a-Chip Application", International Electron Devices Meeting, 23.5.1, IEEE, Apr. 2000.

Shinya Ito, et al., "Mechanical Stress Effect of Etch-Stop Nitride and its Impact on Deep Submicron Transistor Design", International Electron Devices Meeting, 10.7.1, IEEE, Apr. 2000.

A. Shimizu, et al., "Local Mechanical-Stress Control (LMC): A New Technique for CMOS-Performance Enhancement", International Electron Devices Meeting, IEEE, Mar. 2001.

S.E. Thompson, et al., "A Logic Nanotechnology Featuring Strained-Silicon"; Electron Device Letters, IEEE, vol. 25, No. 4, Apr. 2004, pp. 191-193.

K. Ota, et al., "Novel Locally Strained Channel Technique for high Performance 55nm CMOS", International Electron Devices Meeting, 2.2.1, IEEE, Feb. 2002.

G. Zhang, et al., "A New 'Mixed-Mode' Reliability Degradation Mechanism in Advanced Si and SiGe Bipolar Transistors." IEEE Transactions on Electron Devices, vol. 49, No. 12, Dec. 2002, pp. 2151-2156.

H.S. Momose, et al., "Temperature Dependence of Emitter-Base Reverse Stress Degradation and its Mechanism Analyzed by MOS Structures." Paper 6.2, pp. 140-143.

C.J. Huang, et al., "Temperature Dependence and Post-Stress Recovery of Hot Electron Degradation Effects in Bipolar Transistors." IEEE 1991 Bipolar Circuits and Technology Meeting 7.5, pp. 170-173.

S.R. Sheng, et al., "Degradation and Recoveryy of SiGe HBTs Following Radiation and Hot-Carrier Stressing." pp. 14-15.

Z. Yang, et al., "Avalanche Current Induced Hot Carrier Degradation in 200 GHz SiGe Heterojunction Bipolar Transistors." pp. 1-5.

H. Li, et al., "Design of W-Band VCOs with High Output Power for Potential Application in 77 GHz Automotive Radar Systems." 2003 IEEE GaAs Digest, pp. 263-266.

H. Wurzer, et al., "Annealing of Degraded npn-Transistors- Mechanisms and Modeling." IEEE Transactions on Electron Devices, vol. 41, No. 4, Apr. 1994, pp. 533-538.

B. Doyle, et al., "Recovery of Hot-Carrier Damage in Reoxidized Nitrided Oxide MOSFETs." IEEE Electron Device Letters, vol. 13, No. 1, Jan. 1992, pp. 38-40.

H.S. Momose, et al., "Analysis of the Temperature Dependence of Hot-Carrier-Induced Degradation in Bipolar Transistors for Bi-CMOS." IEEE Transactions on Electron Devices, vol. 41, No. 6, Jun. 1994, pp. 978-987.

H.S. Momose, et al., "Temperature Dependence of Emitter-Base Reverse Stress Degradation and its Mechanism Analyzed by MOS Structure." 1989 IEEE, Paper 6.2, pp. 140-143.

H. Wurzer, et al., "Annealing of Degraded non-Transistors-Mechanisms and Modeling." IEEE Transactions on Electron Devices, vol. 41, No. 4, Apr. 1994, pp. 533-538.

M. Khater, et al., "SiGe HBT Technology with Fmax/Ft = 350/300 GHz and Gate Delay Below 3.3 ps". 2004 IEEE, 4 pages.

J.C. Bean, et al., "GEx SI 1-x/Si Strained-Layer Superlattice Grown by Molecular Beam Epitaxy". J. Vac. Sci. Technol. A 2(2), Apr.-Jun. 1984, pp. 436-440.

J.H. Van Der Merwe, "Regular Articles". Journal of Applied Physics, vol. 34, No. 1, Jan. 1963, pp. 117-122.

J.W. Matthews, et al., "Defects in Epitaxial Multilayers". Journal of Crystal Growth 27 (1974), pp. 118-125.

Subramanian S. Iyer, et al. "Heterojunction Bipolar Transistors Using Si-Ge Alloys". IEEE Transactions on Electron Devices, vol. 36, No. 10, Oct. 1989, pp. 2043-2064.

R.H.M. Van De Leur, et al., "Critical Thickness for Pseudomorphic Growth of Si/Ge Alloys and Superlattices", J. Appl. Phys. 64 (6), Sep. 15, 1988, pp. 3043-3050.

D.C. Houghton, et al., "Equilibrium Critical Thickness for SI 1-x GEx Strained Layers on (100) Si". Appl. Phys. Lett. 56 (5), Jan. 29, 1990, pp. 460-462.

Q. Quyang et al., "Two-Dimensional Bandgap Engineering in a Novel Si/SiGe pMOSFET with Enhanced Device Performance and Scalability". 2000, IEEE, pp. 151-154.

* cited by examiner

Nit Etch
Stop on Silicide

METHOD AND STRUCTURE FOR FORMING STRAINED DEVICES

FIELD OF INVENTION

The invention generally relates to semiconductor devices and methods for manufacturing such devices, and more particularly to methods for forming a smooth boundary between nitride films to enhance device performance and product yield.

BACKGROUND DESCRIPTION

Generally, metal-oxide semiconductor transistors include a substrate made of a semiconductor material such as silicon. The transistors typically include a source region, a channel region and a drain region within the substrate. The channel region is located between the source and the drain regions. A gate stack, which usually includes a conductive material, a gate oxide layer and sidewall spacers, is generally provided above the channel region. More particularly, the gate oxide layer is typically provided on the substrate over the channel region, while the gate conductor is provided above the gate oxide layer. The sidewall spacers help protect the sidewalls of the gate conductor.

The current flowing through a channel, which has a given electric field across it, is generally directly proportional to the mobility of the carriers in the channel. Thus, by increasing the mobility of the carriers in the channel, the operation speed of the transistor can be increased. Also, mechanical stresses within a semiconductor device substrate can modulate device performance by, for example, increasing the mobility of the carriers in the semiconductor device. That is, stresses within a semiconductor device are known to enhance semiconductor device characteristics.

Thus, to improve the characteristics of a semiconductor device, tensile and/or compressive stresses are created in the channel of the n-type devices (e.g., NFETs) and/or p-type devices (e.g., PFETs). However, the same stress component, for example tensile stress or compressive stress, improves the device characteristics of one type of device (i.e., n-type device or p-type device) while discriminatively affecting the characteristics of the other type device. By way of example, a tensile stress will improve the performance of an NFET and a compressive force will improve the performance of a PFET. Thus, in order to maximize the performance of both NFETs and PFETs within integrated circuit (IC) devices, the stress components should be engineered and applied differently for NFETs and PFETs.

To selectively create tensile stress in an NFET and compressive stress in a PFET, distinctive processes and different combinations of materials are used. For example, a trench isolation structure has been proposed for forming the appropriate stresses in the NFETs and PFETs, respectively. When this method is used, the isolation region for the NFET device contains a first isolation material which applies a first type of mechanical stress on the NFET device in a longitudinal direction (parallel to the direction of current flow) and in a transverse direction (perpendicular to the direction of current flow). Further, a first isolation region and a second isolation region are provided for the PFET and each of the isolation regions of the PFET device applies a unique mechanical stress on the PFET device in the transverse and longitudinal directions.

Alternatively, methods have been proposed for providing a single strain layer on the entire device, using two lithography masks for patterning. By way of one illustrative example, a single nitride layer with a first stress component is placed over the entire structure, e.g., NFET and PFET, after silicidation. In the example discussed herein, the first nitride layer imposes a tensile component within the channel of the NFET. An oxide hard mask is then deposited over the nitride layer, and a photo resist is placed over one of the transistors, e.g., NFET. A reactive ion etching (RIE) is then performed to remove the hard mask over the PFET and the remaining photo resist over the NFET. A nitride etch is then performed to remove the nitride layer over the PFET.

A nitride layer with a compressive component is then placed over the PFET and the hard mask over the NFET, across a trench isolation structure (STI). This nitride layer will impose a compressive component in the PFET to enhance device performance. A photo resist is then deposited over the nitride layer of the PFET and across the STI. This photo resist also overlaps the tensile nitride layer of the NFET, taking into consideration only the vertical edge of the first nitride layer during the mapping process. A nitrogen etching process is then performed, which etches away the compressive nitrogen layer over portions of the NFET.

However, due to normal alignment errors of the patterning process, e.g., placement of the photoresist and difficulties controlling the etching, an overlap of the nitride layers is formed near the boundary of the compressive nitride layer and the tensile nitride layer. Namely, the compressive nitride layer remains over portions of the hard mask and the tensile nitride layer over a gate poly and the STI, resulting in three layers of material. These overlaps result in subsequent etching difficulties at this overlap region.

These same alignment errors can also cause gaps between the nitride layers; however, such a gap is not very desirable because metal ions such as Cu can diffuse into silicon from back-end-of-the-line process. Thus, it is very important to ensure that there are no gaps. To guarantee that there are no gaps, further compensations are made in the etching process so that the nitride layers fill any gaps. Although such compensation ensures that the nitride layers will prevent such out diffusing, a larger overlap can occur.

In further processing steps, an oxide layer is deposited over the nitride layers, and vias are then etched into the oxide layer. A metal is then placed in the vias to create via contacts to the source and drain regions of the device. However, etching becomes very difficult due to the variations in layer thickness, especially at the overlap of the nitride layers. For example, etching in the overlap region (i.e., over the nitride layers and the hard mask layer) to make contact with the device results in over etching of the remaining portions of the device. On the other hand, etching designed for the portions of the device with one or two layers will result in an under etch of the overlap region. This under etch will result in a layer blocking contact between the device and the contact. (FIG. 1).

While these methods do provide structures that have tensile stresses being applied to the NFET device and compressive stresses being applied to the PFET device, they may require additional materials and/or more complex processing, and thus, resulting in higher cost. Further, due to the inaccuracies of the etching processes, an under etch or over etch can result in portions of the device. In the case of under etching in the overlap region, the contact will be blocked from contacting the device.

SUMMARY OF THE INVENTION

In a first aspect of the invention, a method for manufacturing a device includes mapping extreme vertical boundary conditions of a mask layer based on vertical edges of a deposited first layer and a second layer. The mask layer is deposited over portions of the second layer based on the mapping step. The exposed area of the second layer is etched to form a smooth boundary between the first layer and the second layer. The resist layer is stripped.

In a second aspect of the invention, the method includes depositing a first strain layer over a first device and depositing a second strain layer over a second device and a portion of the first strain layer. A mask layer is deposited over portions of the second strain layer, where an edge of the mask layer will not exceed extreme vertical boundary conditions measured from vertical edges of the first strain layer and the second strain layer. The exposed areas of the second strain layer are etched to form a smooth boundary between the first strain layer and the second strain layer. The mask layer is then stripped.

In another aspect of the invention, a semiconductor device comprises a semiconductor substrate having at least one p-type device and one n-type device. A first strain layer imposes a compressive stress in the p-type device and a second strain layer imposes a tensile stress in the n-type device. A smooth boundary is provided between the first strain layer and the second strain layer. A dielectric layer is deposited over the first strain layer and the second stain layer, including the smooth boundary. A via contact is formed in the dielectric layer and connects to one of the n-type device and p-type device at the smooth boundary.

DETAILED DESCRIPTION OF EMBODIMENTS OF THE INVENTION

The invention provides a method for fabricating devices with improved performance characteristics. In one aspect of the invention, a smooth boundary is formed between two films or layers, i.e., a layer that imposes a tensile component in an NFET and a layer that imposes a compressive component in a PFET. The smooth boundary does not have gaps or overlaps between the layers. The smooth boundary of the tensile and compressive films is also critical to improved product yield.

To form a smooth boundary between two strain layers, a resist pattern is aligned to a vertical portion of the second layer, e.g., $Si_3N_4$, so that a minimum overlap overlay condition of the resist is aligned to the outer surface of the vertical portion of the second nitride layer. Then, an isotopic etch process is applied to remove the second nitride layer from the exposed surface and some or all of a vertical portion of the second nitride layer that is covered by the resist. In one implementation, the second layer is aligned to the first layer pattern to provide the smallest overlap possible.

Figure 1:
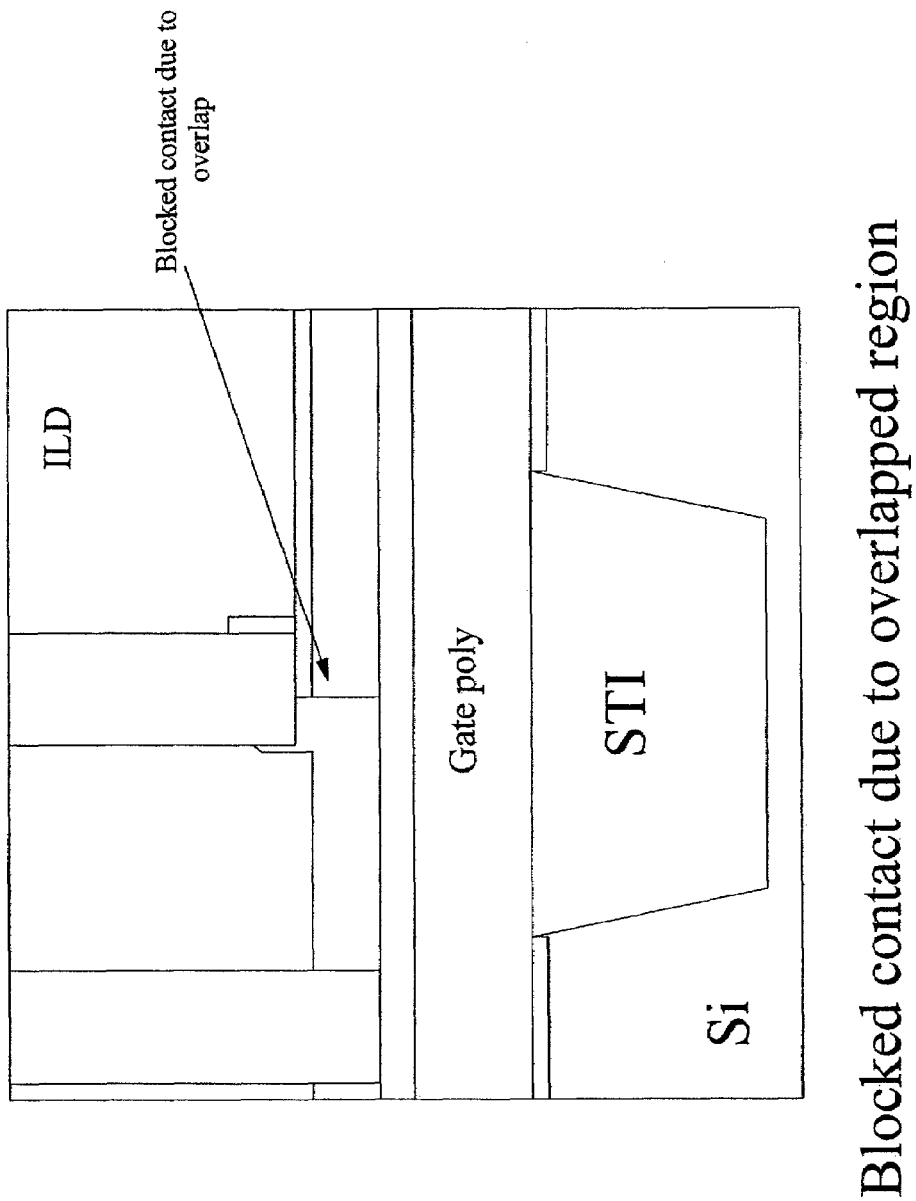
FIG. 1 illustrates a conventional structure.
Figure 2:
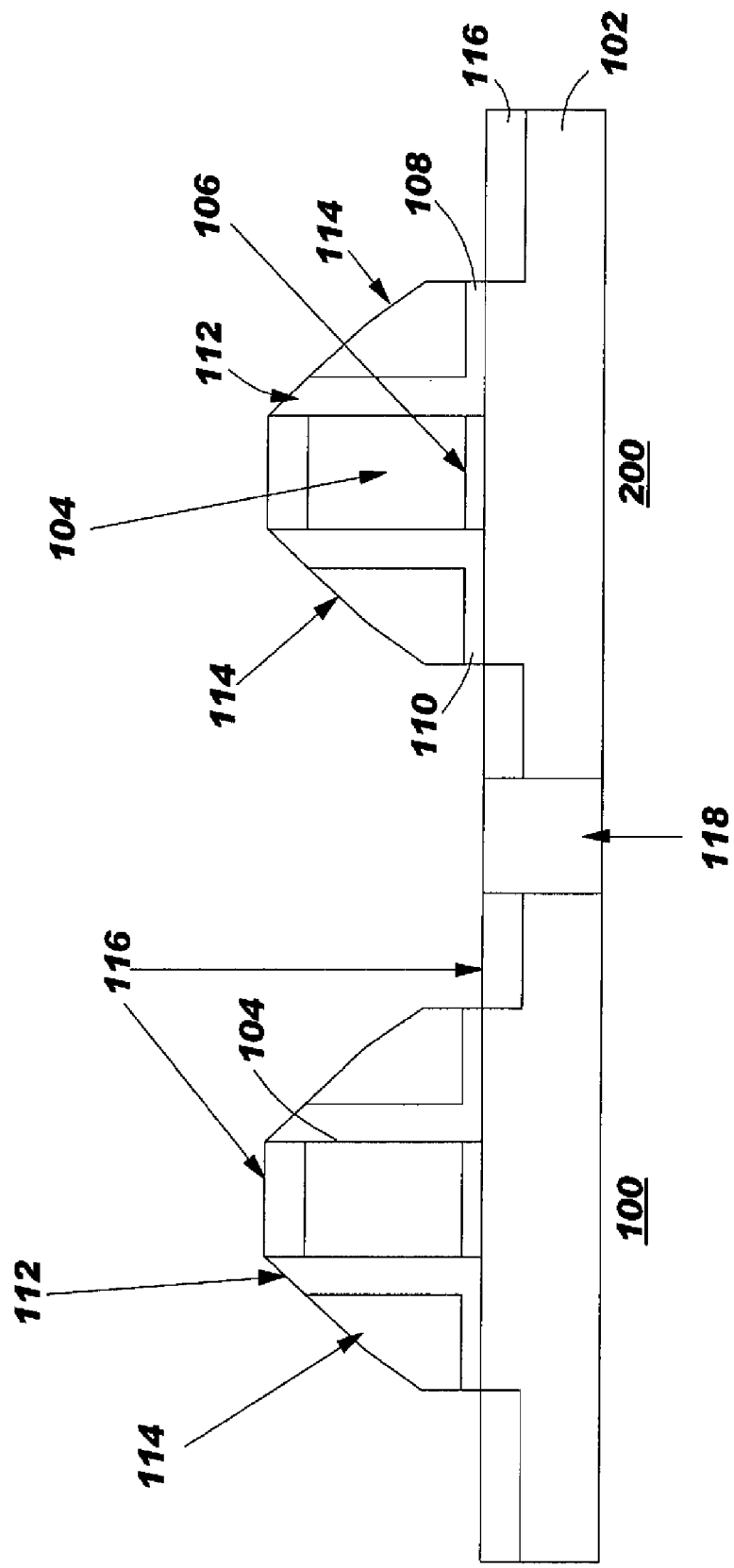
FIG. 2 illustrates a beginning structure for forming stress components for a p-type transistor and n-type transistor according to the invention.

FIG. 2 illustrates a beginning structure for forming stress components for a p-type transistor and n-type transistor according to the invention. In FIG. 2, a PFET 100 and NFET 200 are formed in a conventional manner in a substrate 102, such as silicon. A gate polysilicon 104 is formed over a gate oxide 106 on the substrate 102. Source and drain regions 108 and 110 are formed in the substrate 102 using known dopants such as arsenic, for example. An oxide spacer 112 is formed on sides of the gate polysilicon 104, with nitride spacers 114 formed on the oxide spacers 112. A silicide 116 is formed on the exposed portions of the substrate 102 and on the top of the gate polysilicon 104. An STI region 118 is formed between the PFET 100 and NFET 200.

Figure 3:
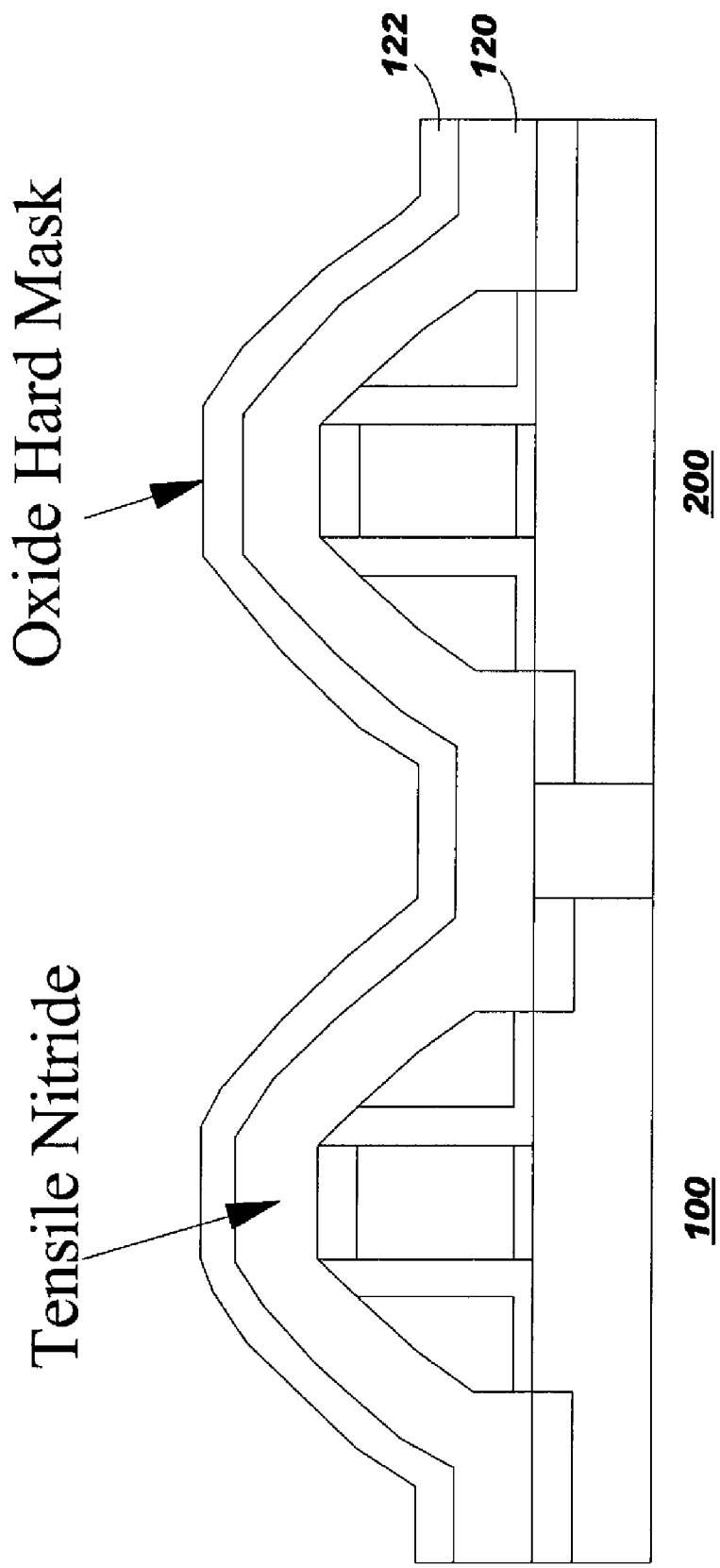
FIGS. 3-8 illustrate exemplary processes for forming stress components for a p-type transistor and n-type transistor according to the invention.

In FIG. 3, a first layer 120 such as, for example, a nitride layer, is formed over the structure of FIG. 2. In the exemplary illustration of FIG. 2, the first nitride layer 120 generates a tensile stress in the NFET channel in order to enhance the performance of the NFET 200. Those of skill in the art should recognize, though, that the first nitride layer 120 might generate a compressive stress to enhance the performance of the PFET. In this latter scenario, a tensile nitride layer would then be deposited to enhance the performance of the NFET. These layers will be termed hereinafter "tensile" and "compressive" for sake of convenience. In one application using a current 248 nm lithographic tool, the first nitride layer is approximately 75 nm with very good conformality. An oxide hard mask 122 is deposited over the first nitride layer 120.

Figure 4:
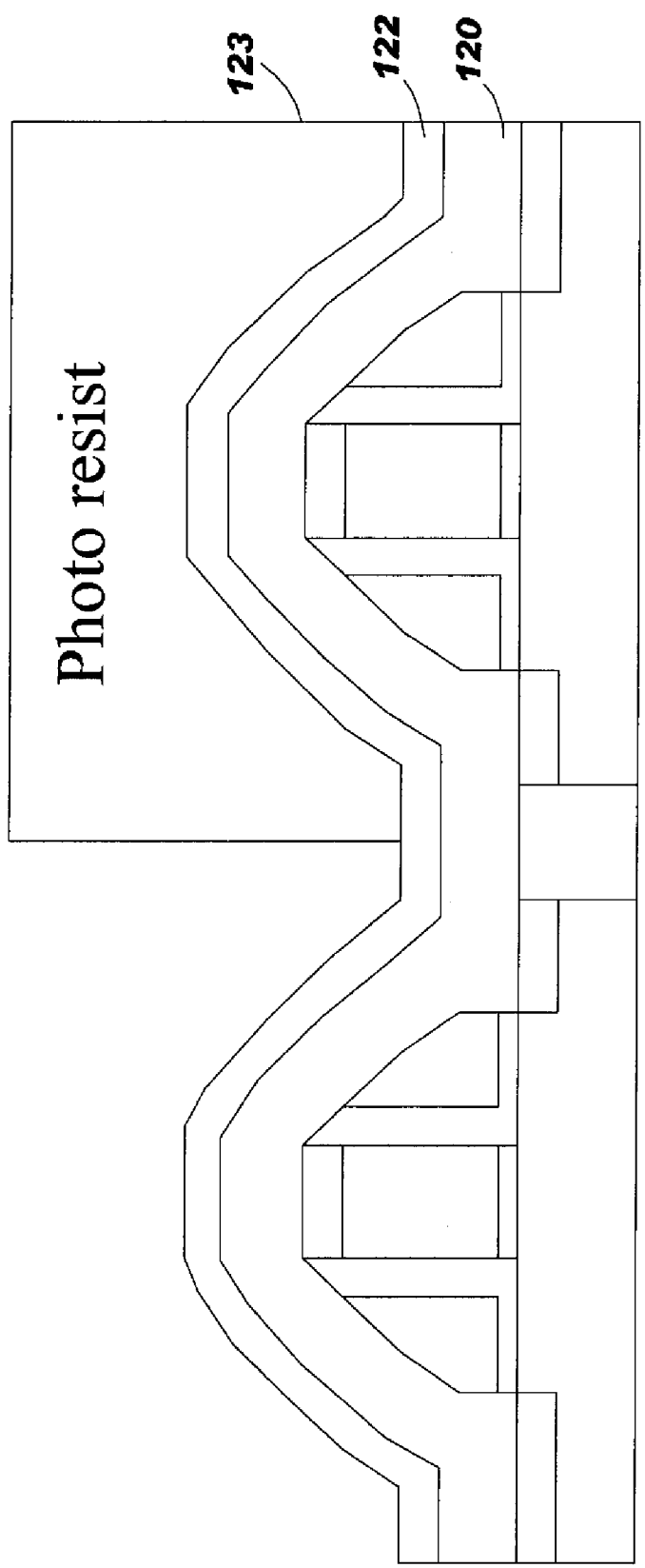

FIG. 4 illustrates an exemplary process for forming a photoresist mask 123 on the oxide hard mask 122, over the NFET 200. In this exemplary illustration, the first nitride layer 120 is a tensile nitride layer and the photoresist mask 123 will protect the tensile nitride layer during subsequent etching process. However, in the event that the first nitride layer 120 is a compressive nitride layer, the photoresist mask 123 would then be placed over the PFET to protect the compressive nitride layer during subsequent etching process.

Figure 5:
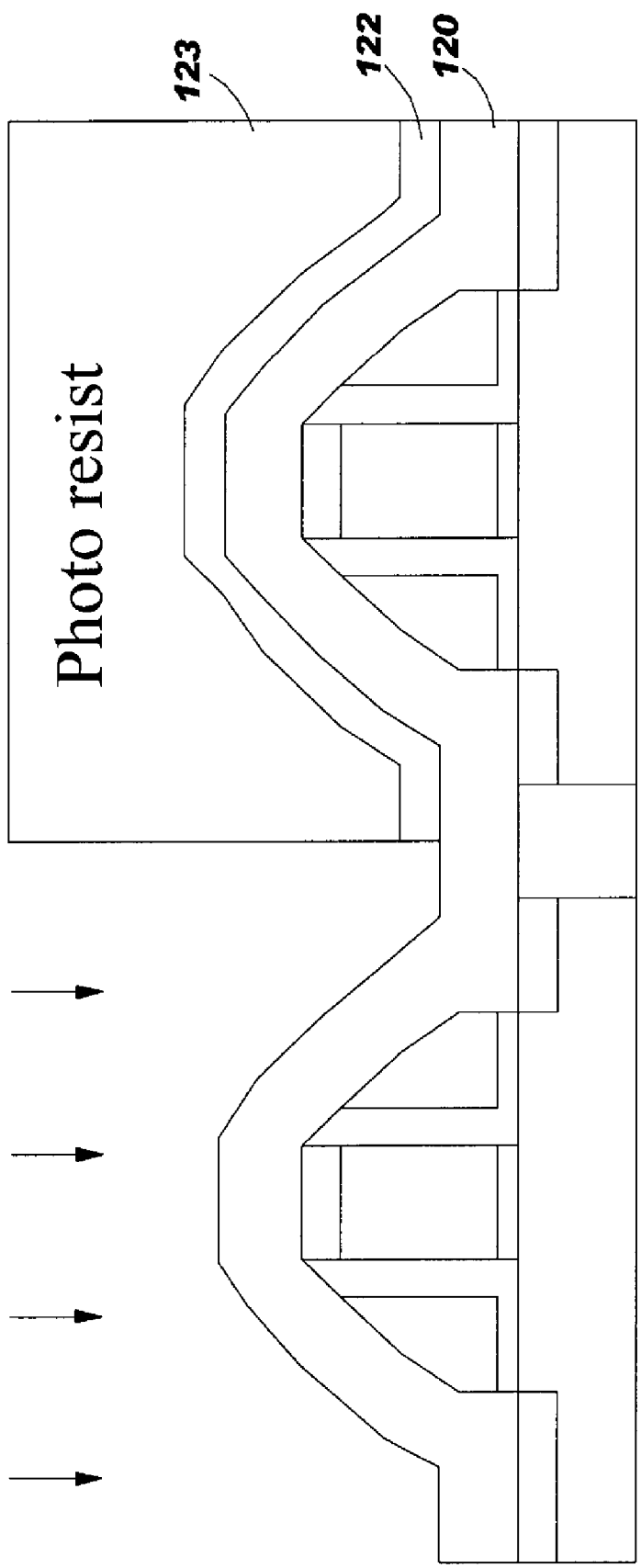
Figure 6:
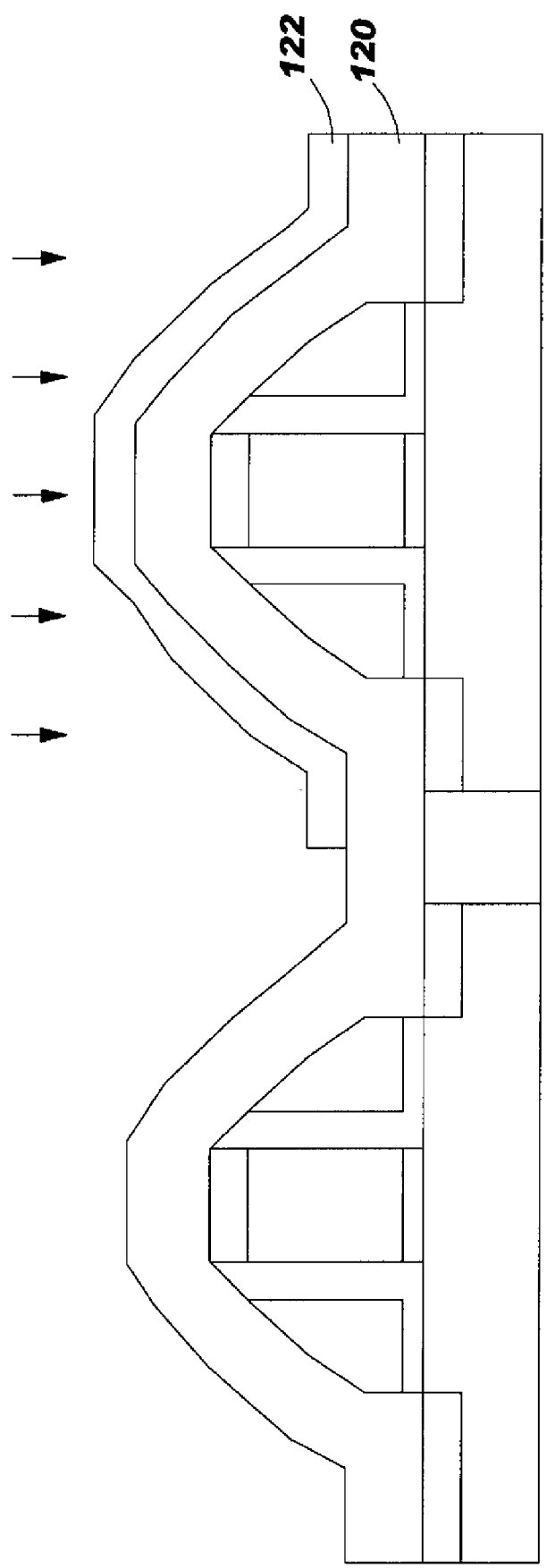
Figure 7:
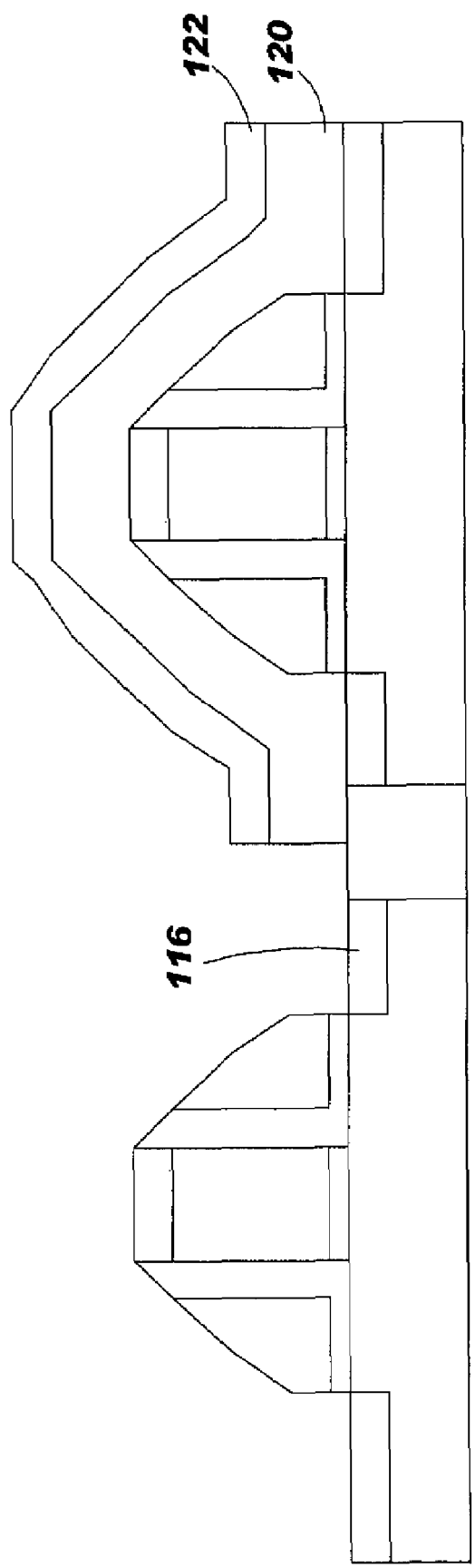

FIGS. 5-7 illustrate additional processing steps. FIG. 5 illustrates an oxide etching process in which the oxide hard mask 122 is etched or removed from the PFET. In FIG. 6, the photo resist mask 123 is stripped to expose the underlying oxide hard mask 122, over the NFET. FIG. 7 illustrates a nitride etch to strip the nitride over the PFET 100. The nitride etch will stop at the silicide layer 116. These processes can equally be used for a compressive nitride layer provided over the PFET, during the initial processing stages.

Figure 8:
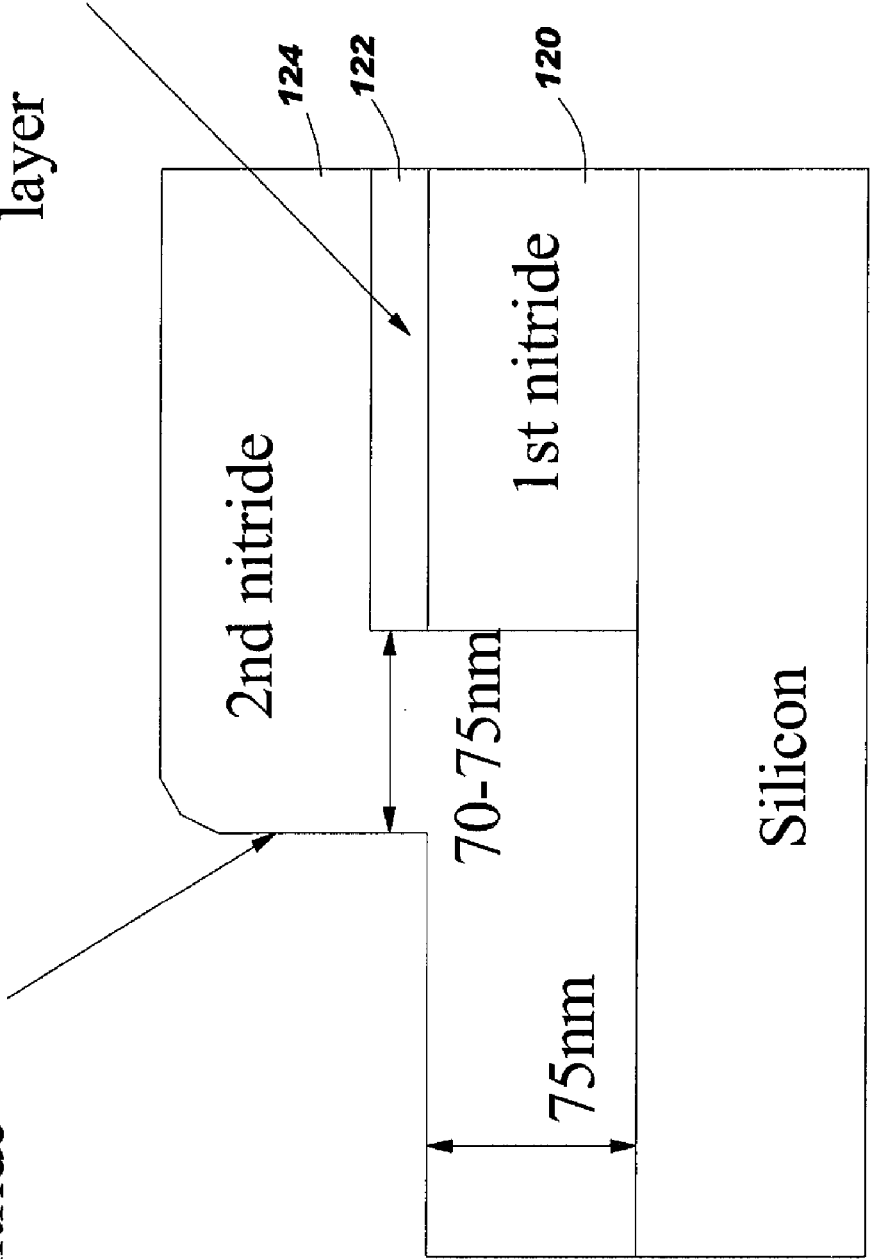

FIG. 8 illustrates the deposition of a second nitride layer 124. In this illustration, the second nitride layer 124 is a compressive nitride layer deposited after the first nitride layer 120 is patterned. In the illustration shown, the thickness of the second nitride layer 124 is approximately 75 nm with very good conformality. The width of the vertical portion of the second nitride layer 124 is similar to the maximum overlap size, e.g., approximately 70 to 75 nm. In embodiments, vertical film thickness is in a range of alignment error +/−50 nm. As discussed in more detail below, the oxide layer 122 will act as an etch stop during the second nitride etching process.

Figure 9:
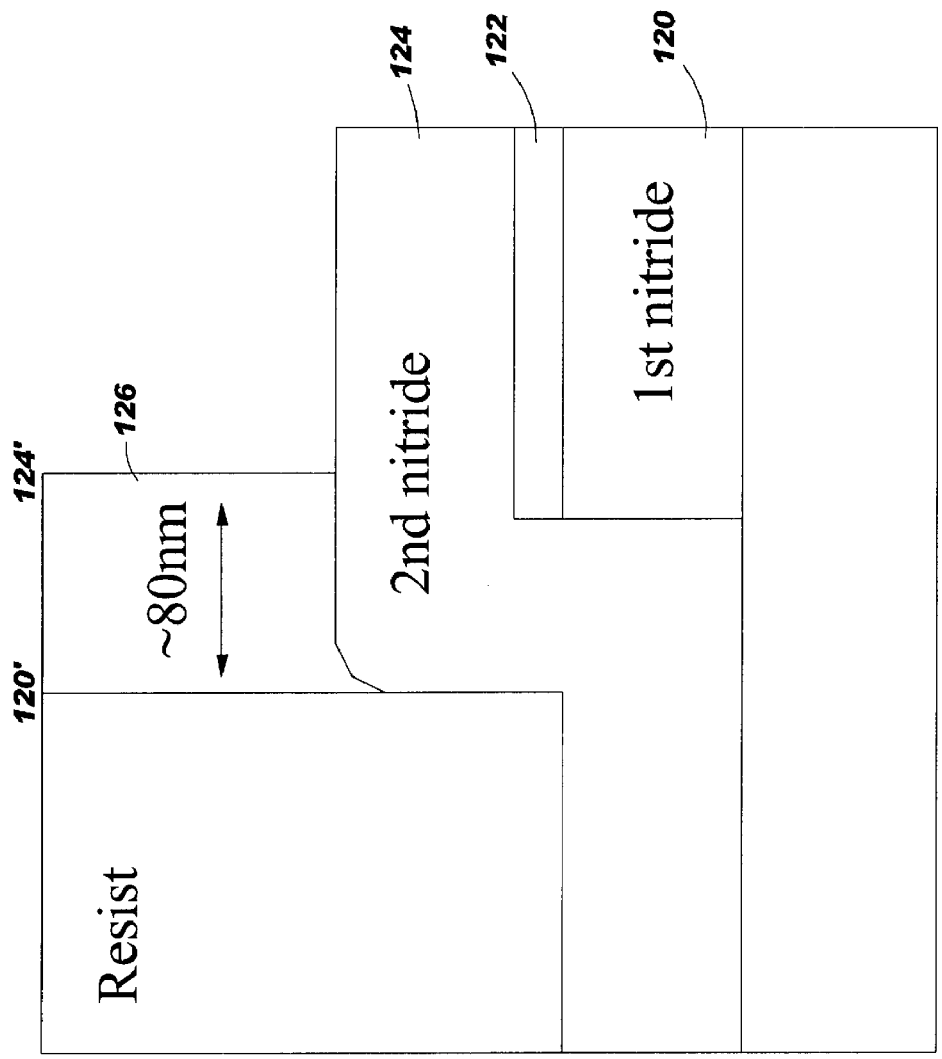
FIG. 9 illustrates boundary conditions for a resist pattern according to the invention.

FIG. 9 illustrates extreme vertical boundary conditions for a resist pattern according to the invention. These extreme boundary conditions are used to map the edges of the resist layer and to ensure a smooth boundary region between the first nitride layer 120 and the second nitride layer 124 after etching. As should be understood, though, edge conditions within the extreme edge conditions can be used in accordance with the invention to achieve the smooth boundary layer between the nitride layers.

In the example of FIG. 9, a resist layer 126 is formed over the second nitride layer 124. In designing or mapping this resist layer 126, two considerations are taken in account during the design process: (i) the edge 120' of the first nitride layer 120 and (ii) the vertical edge 124' of the second nitride layer 124. The distance between the vertical edges 120' and 124' is considered the inner and outer tolerances of the mask layer 126. In 90 nm or 65 nm technology, the overlay tolerance is approximately 40 nm, so the maximum overlap of the photo resist is approximately 80 nm, including the vertical portion of the second nitride layer 124. The 80 nm dimension provides a slight overlap with the edge of the first nitride layer 120. These extreme vertical edge conditions can be adjusted depending on other technologies or other considerations, as should be understood by those of skill in the art.

Figure 10:
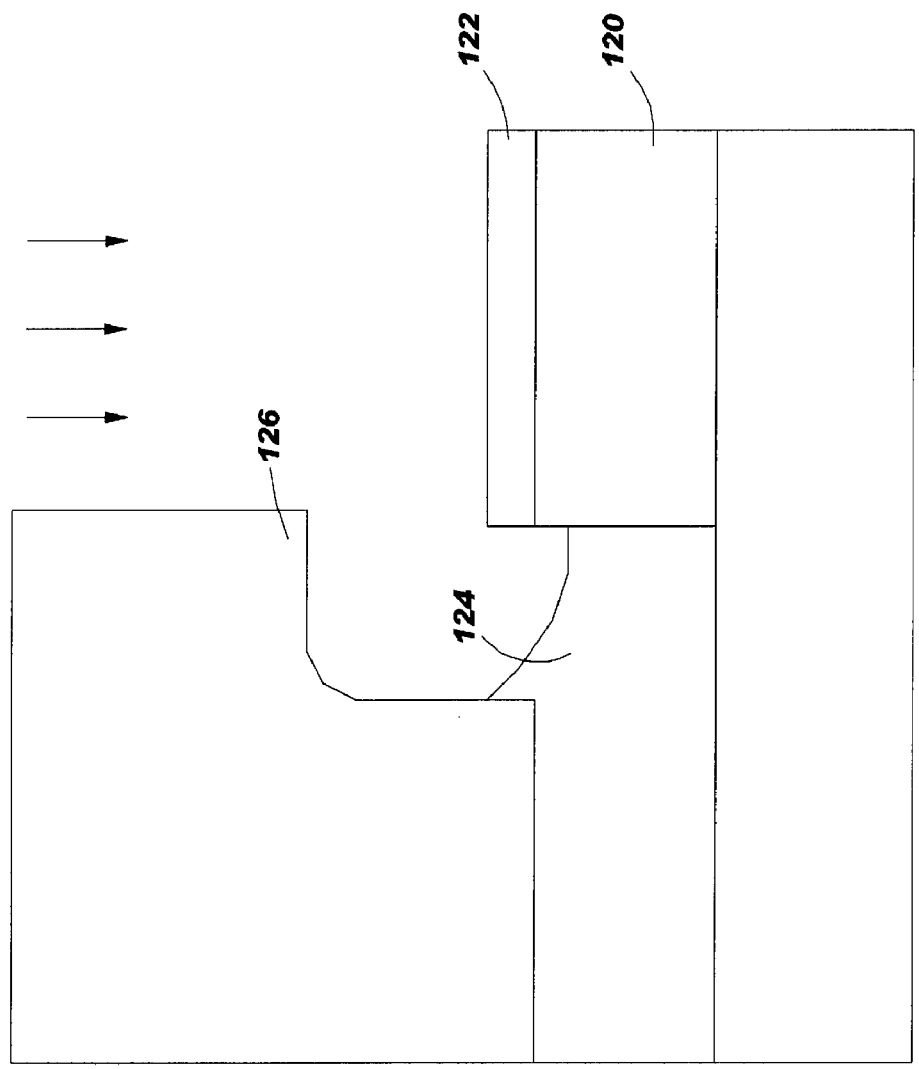
FIGS. 10 and 11 illustrate an exemplary process using one boundary condition according to the invention.
Figure 11:
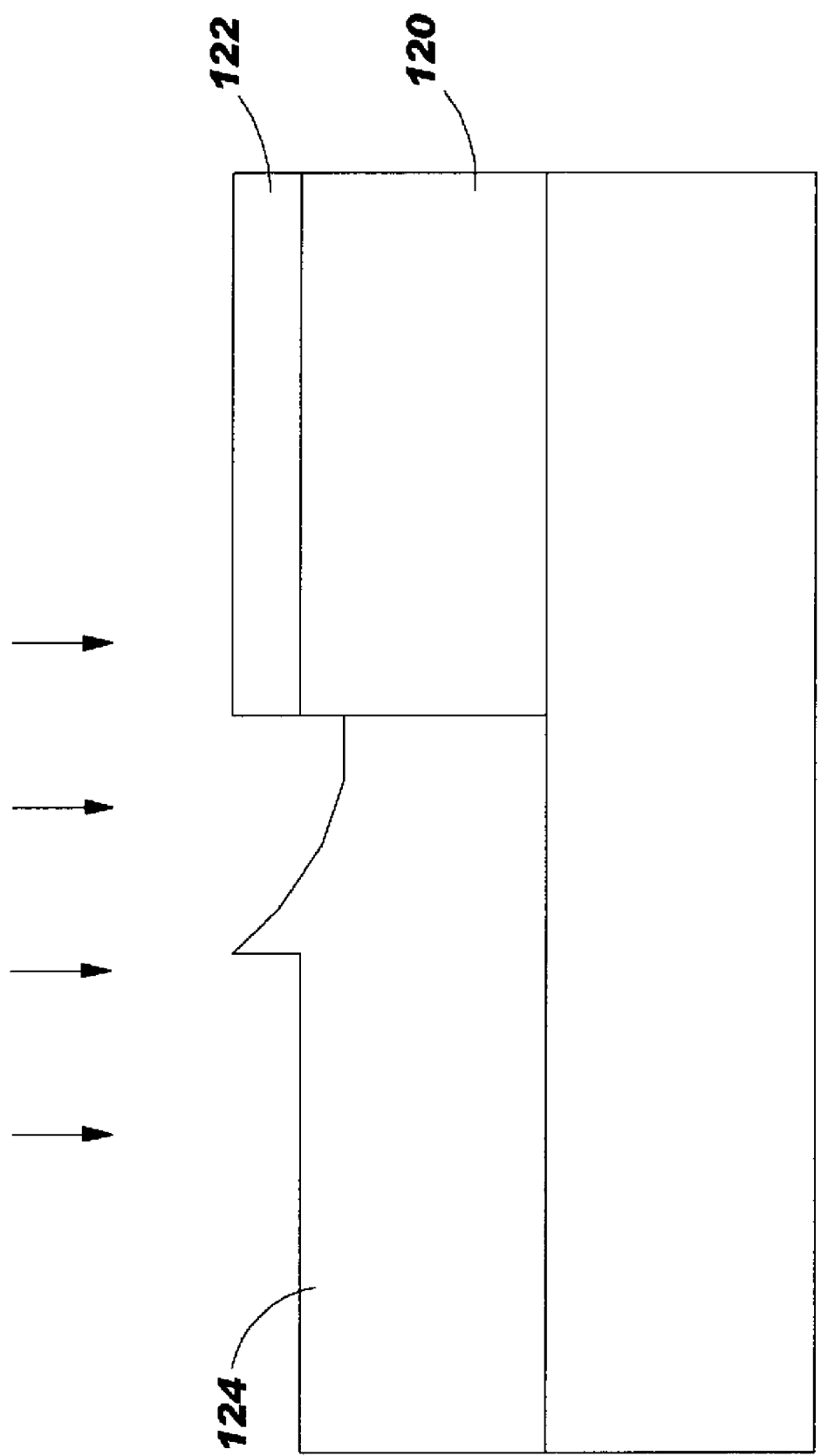

FIGS. 10 and 11 illustrate the process of providing a smooth boundary between the first nitride layer 120 and the second nitride layer 124, using the example of the extreme outer edge 124'. In the process steps of FIG. 10, an isotropic $Si_3N_4$ RIE process is used to remove the second nitride layer 124 in the photo resist 126 opening, as well as laterally below the photo resist 126. During this RIE, the oxide layer 122 acts as an etch stop to protect the edge of the first nitride layer 120. FIG. 11 illustrates the removal or stripping of the photo resist 126. As shown, these process steps result in a smooth boundary between the first nitride layer 120 and the second nitride layer 124, e.g., no overlap.

Figure 12:
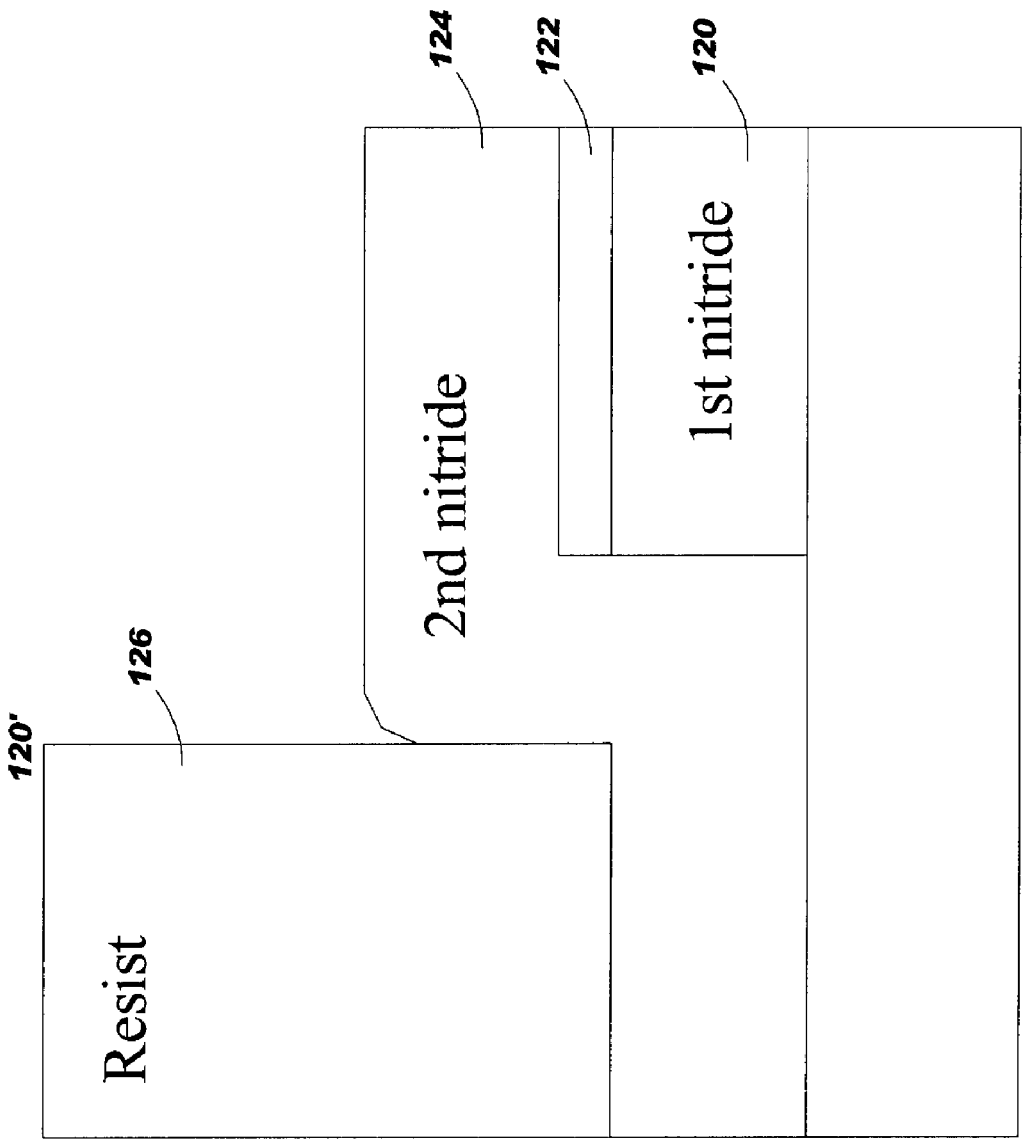
FIG. 12 illustrates an another boundary condition according to the invention.
Figure 13:
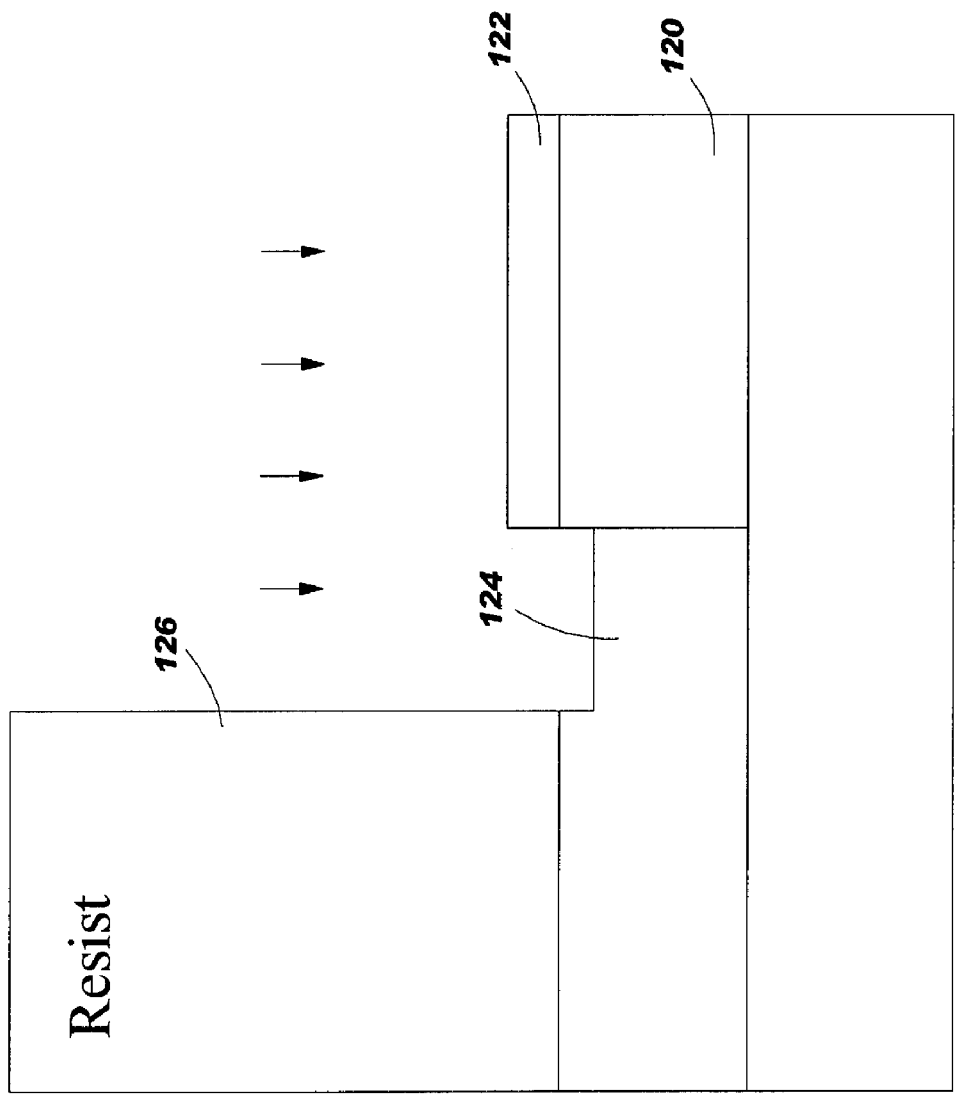
FIGS. 13 and 14 illustrate an exemplary process using the boundary condition of FIG. 12.
Figure 14:
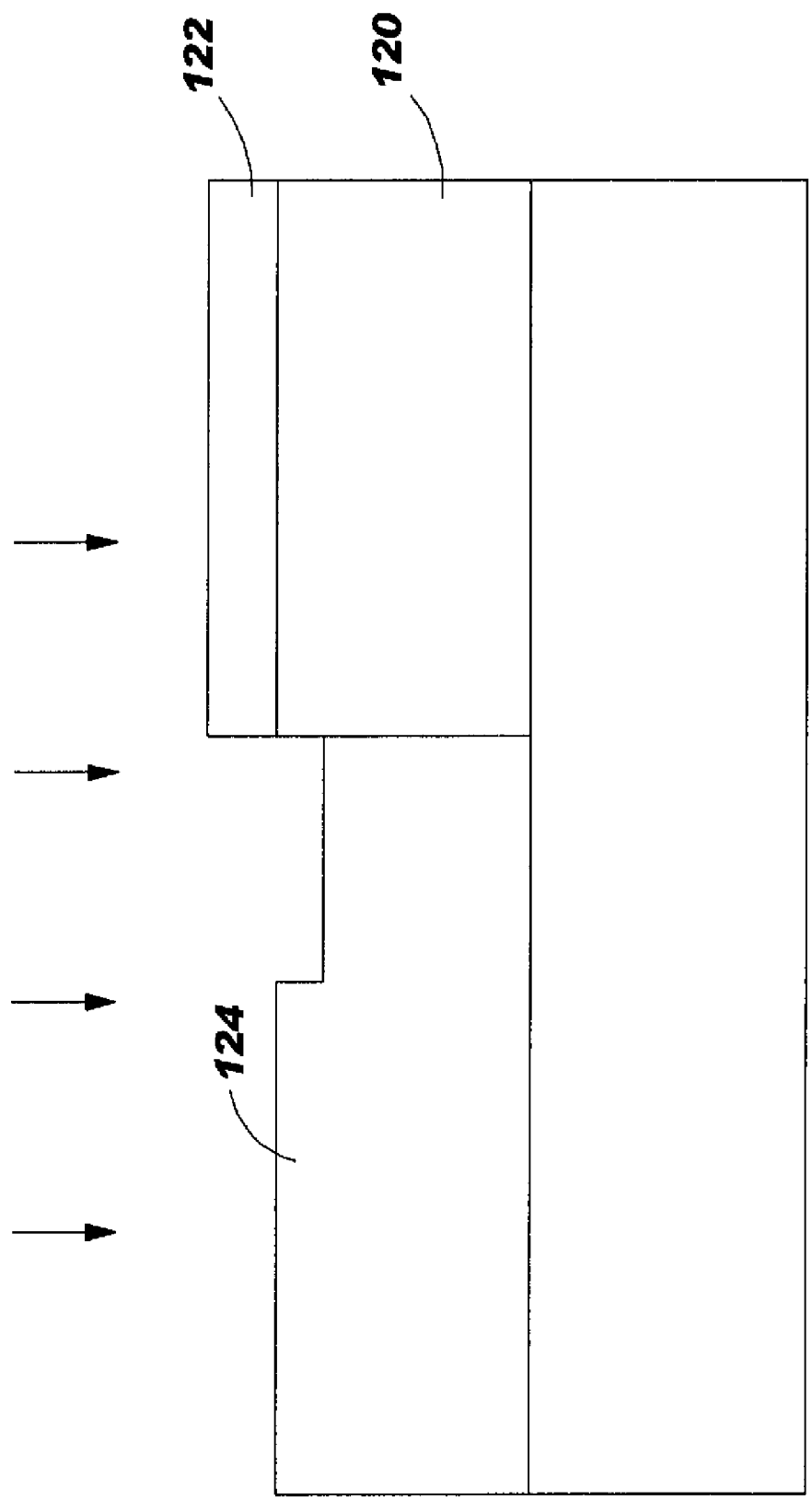

FIGS. 13 and 14 illustrate the process of providing a smooth boundary between the first nitride layer 120 and the second nitride layer 124, using the example of the extreme inner edge 120' shown in FIG. 12. In the process steps of FIG. 13, an isotropic RIE process is used to remove the second nitride layer 124 in the photo resist 126 opening. Similar to that described with reference to FIG. 10, during this RIE, the oxide layer 122 acts as an etch stop to protect the edge of the first nitride layer 120. FIG. 14 illustrates the removal or stripping of the photo resist. As shown, these process steps result in a smooth boundary between the first nitride layer 120 and the second nitride layer 124, e.g., no overlap.

Figure 15:
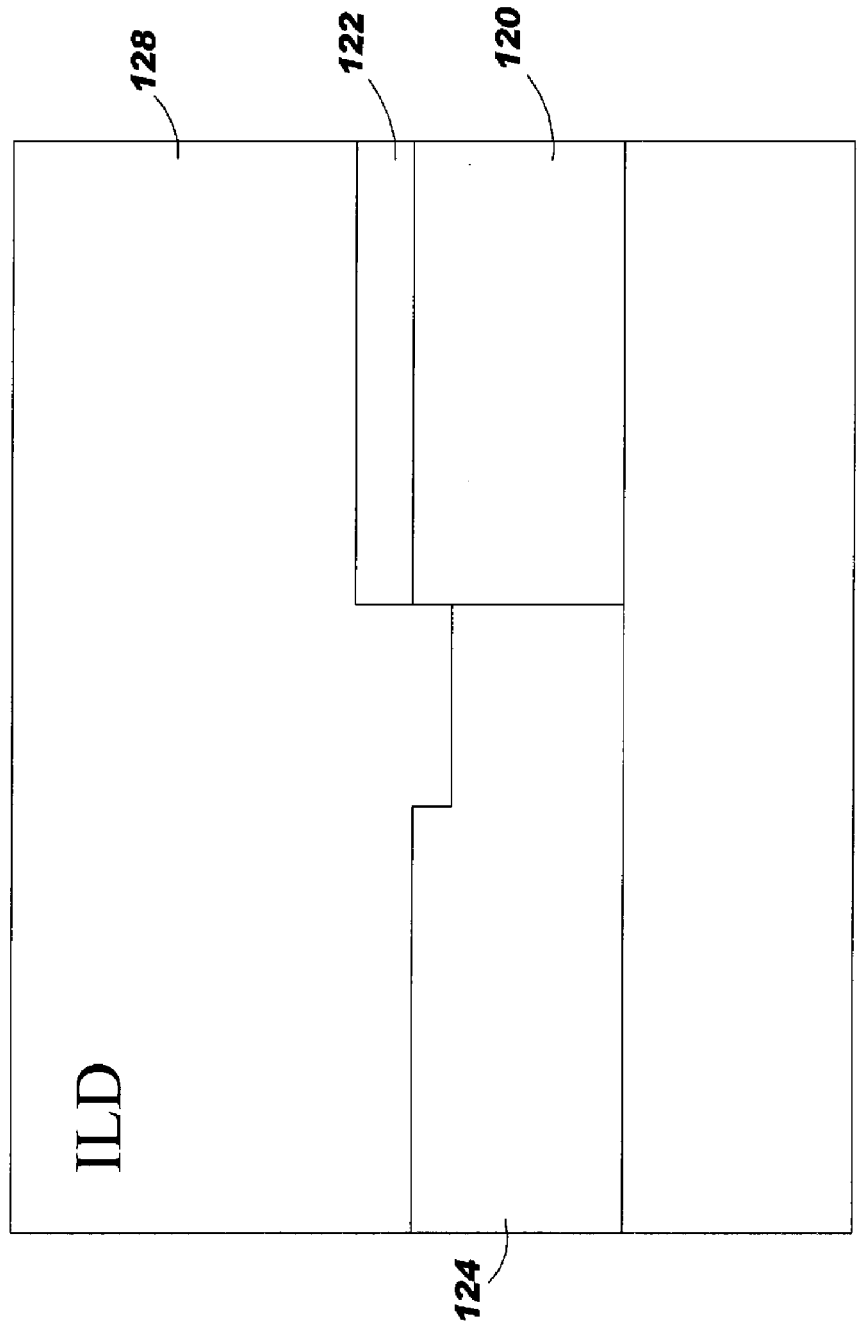
FIGS. 15 and 16 illustrate end processes for forming stress components for a p-type transistor and n-type transistor using the boundary conditions of either FIGS. 10-11 or FIGS. 12-13 according to the invention.
Figure 16:
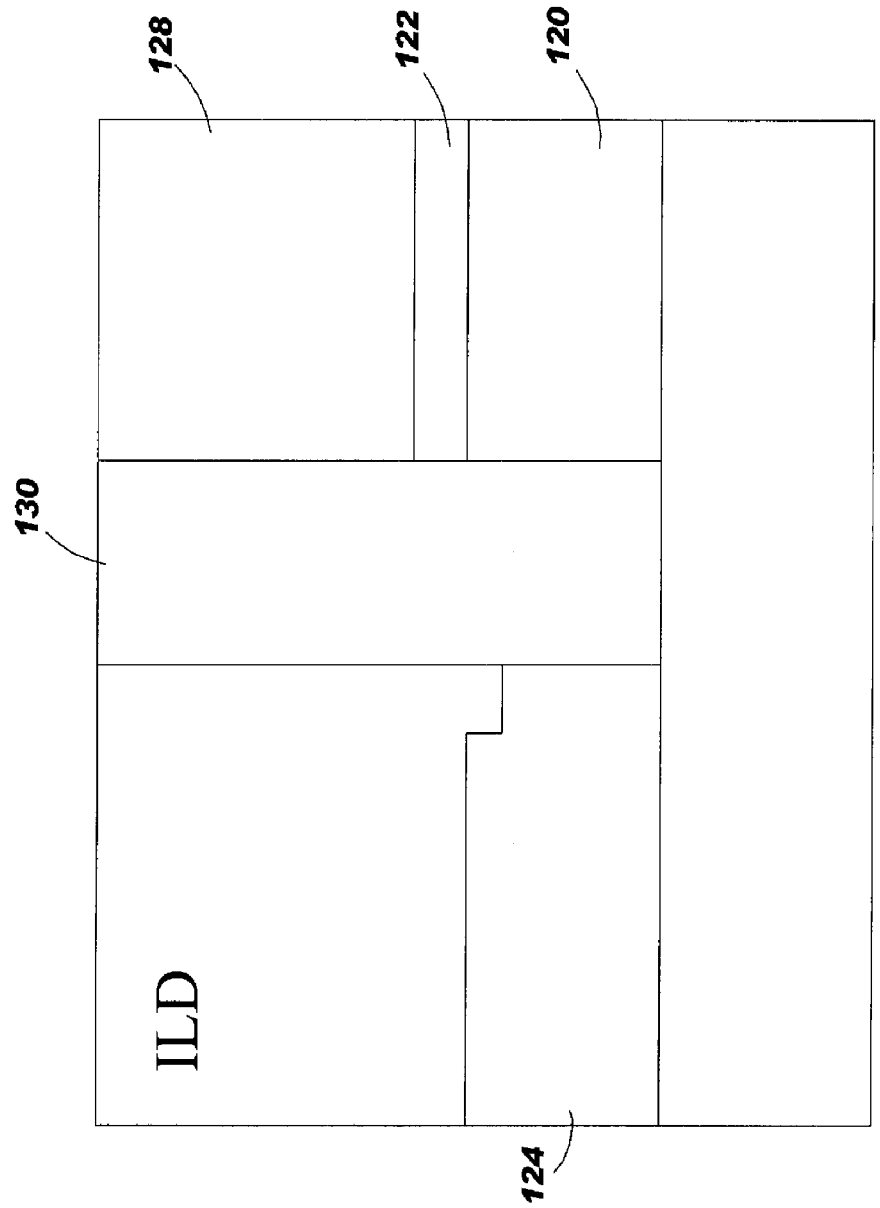

FIGS. 15 and 16 show end processes for forming the contacts. In FIG. 15, an inter level dielectric 128 is formed over the nitride layers 120 and 124. The inter level dielectric 128 may be a deposited TEOS, BPSG or low K dielectric material. The interlevel dielectric 128 is then planarized using, for example, a chemical or mechanical polishing process. As seen in the illustration of FIG. 16, a contact via with a metallization formed therein, generally represented as reference numeral 130, is then formed in the interlevel dielectric 128. In the processes described herein, since there is a smooth boundary between the nitride layers 120 and 124, over or under etching is no longer problematic and the metallization properly makes contact with the device.

Figure 17:
FIG. 17 shows a cross-section of a semiconductor substrate according to the invention using a scanning electron microscope.

FIG. 17 shows a cross-section of a semiconductor substrate, manufactured in accordance with the invention, using a scanning electron microscope. As shown in this illustration, a smooth boundary layer is provided between the nitride layers 120 and 124. That is, the smooth boundary layer is formed as abutting ends of the nitride layers 120 and 124.

In the invention, the NFET and PFET devices are enhanced simultaneously using dual silicon nitride liners. In the invention, the smooth boundary between the nitride films will not block the contact to the NFET or PFET. Also, due to the strain engineering, a gap is not formed and metal ions will not diffuse into the silicon from BEOL.

While the invention has been described in terms of embodiments, those skilled in the art will recognize that the invention can be practiced with modification within the spirit and scope of the appended claims.

What is claimed is:

1. A semiconductor device, comprising:
   a semiconductor substrate having at least one p-type device and one n-type device;
   a first strain layer imposing a compressive stress in the p-type device;
   a second strain layer imposing a tensile stress in the n-type device;
   a smooth boundary provided between the first strain layer and the second strain layer;
   a dielectric layer deposited over the first strain layer and the second strain layer, including the smooth boundary; and
   at least one via contact formed in the dielectric layer and connecting to one of the n-type device and p-type device at the smooth boundary,
   wherein one of the at least one via contact is in contact with the first strain layer and the second strain layer, and
   wherein the smooth boundary is devoid of overlaps.

2. The device of claim 1 wherein the smooth boundary is devoid of gaps.

3. The device of claim 1 wherein the at least one via contact is plural via contacts, the plural via contacts contacting the n-type device and p-type device at the smooth boundary and at locations other than the smooth boundary.

4. A semiconductor device, comprising:
   a semiconductor substrate having at least one p-type device and one n-type device;
   a first strain layer imposing a compressive stress in the p-type device;
   a second strain layer imposing a tensile stress in the n-type device;
   a smooth boundary provided between the first strain layer and the second strain layer;
   a dielectric layer deposited over the first strain layer and the second strain layer, including the smooth boundary; and
   at least one via contact formed in the dielectric layer and connecting to one of the n-type device and p-type device at the smooth boundary,
   wherein one of the at least one via contact is in contact with the first strain layer and the second strain layer, and
   wherein the smooth boundary is defined as abutting ends of the first strain layer and the second strain layer.

* * * * *

UNITED STATES PATENT AND TRADEMARK OFFICE
CERTIFICATE OF CORRECTION

PATENT NO. : 7,545,004 B2  Page 1 of 1
APPLICATION NO. : 10/907689
DATED : April 12, 2005
INVENTOR(S) : Haining S. Yang It is certified that error appears in the above-identified patent and that said Letters Patent is hereby corrected as shown below:

On the cover page item [73] Assignee: change

"International Business Machines Corporation"

to:

--International Business Machines Corporation and Chartered Semiconductor Manufacturing Ltd.--

Signed and Sealed this

Twenty-fourth Day of November, 2009

David J. Kappos
*Director of the United States Patent and Trademark Office*